(12) United States Patent
Wu et al.

(10) Patent No.: US 11,353,598 B2
(45) Date of Patent: Jun. 7, 2022

(54) METHOD AND DEVICE FOR PROCESSING INFORMATION AND STORAGE MEDIUM

(71) Applicant: Beijing Xiaomi Mobile Software Co., Ltd., Beijing (CN)

(72) Inventors: Ke Wu, Beijing (CN); Yingchun Xie, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 386 days.

(21) Appl. No.: 16/550,827

(22) Filed: Aug. 26, 2019

(65) Prior Publication Data
US 2020/0103535 A1    Apr. 2, 2020

(30) Foreign Application Priority Data
Sep. 29, 2018   (CN) .......................... 201811150840.0

(51) Int. Cl.
*G01T 1/16* (2006.01)
*G01T 1/36* (2006.01)
*G06F 9/54* (2006.01)
*G21F 3/00* (2006.01)

(52) U.S. Cl.
CPC ................. *G01T 1/16* (2013.01); *G01T 1/36* (2013.01); *G06F 9/542* (2013.01); *G21F 3/00* (2013.01)

(58) Field of Classification Search
CPC ... G01T 1/16; G01T 1/36; G06F 9/542; G21F 3/00
See application file for complete search history.

(56) References Cited

U.S. PATENT DOCUMENTS

| 9,470,731 B1 | 10/2016 | Fischer et al. |
| 2011/0163892 A1 | 7/2011 | Groves et al. |

(Continued)

FOREIGN PATENT DOCUMENTS

| CN | 103516442 A | 1/2014 |
| CN | 104459346 A | 3/2015 |

(Continued)

OTHER PUBLICATIONS

Wang Lihua & Zhang Qihong, *Discussion on Construction of Environmental Electromagnetic Radiation Mobile Monitoring System*, Chin J Radiol Health, vol. 17, No. 3, Sep. 2008, 14 pages.

(Continued)

*Primary Examiner* — Hugh Maupin
(74) *Attorney, Agent, or Firm* — Finnegan, Henderson, Farabow, Garrett & Dunner, L.L.P.

(57) ABSTRACT

Embodiments of the present disclosure provide a method and a device for processing information and a storage medium. The method includes: obtaining intensities of electromagnetic radiation of locations which a mobile device passes during movement of the mobile device; creating a distribution map of electromagnetic radiation according to the intensities of electromagnetic radiation, the distribution map of electromagnetic radiation being configured to reflect an electromagnetic radiation distribution of a route which the mobile device passes; and generating a protective measure against the electromagnetic radiation according to the distribution map of electromagnetic radiation.

18 Claims, 4 Drawing Sheets

(56) References Cited

U.S. PATENT DOCUMENTS

2011/0313651 A1* 12/2011 Hyde .................. G08B 3/10
                                                    701/400
2014/0039821 A1   2/2014 Audet
2017/0350754 A1* 12/2017 Brown ................ G08B 25/08

FOREIGN PATENT DOCUMENTS

| CN | 105004931 A | 10/2015 |
| CN | 204740297 U | 11/2015 |
| WO | WO 2010/076800 A2 | 7/2010 |
| WO | WO 2015/003139 A1 | 1/2015 |

OTHER PUBLICATIONS

Extended Search Report for European Application No. 19198510.0 from the European Patent Office, dated Nov. 13, 2019.
Chen et al., *The Research on Shielding Effectiveness Measurement for Electromagnetic Shielding Garments*, 2017 7$^{th}$ IEEE International Symposium on Microwave, Antenna, Propagation, and EMC Technologies (MAPE), IEEE, Oct. 24, 2017, pp. 336-340.
Notification to Grant Patent Right for Invention, Chinese Application No. 201811150840.0, dated Aug. 25, 2021.

\* cited by examiner

METHOD AND DEVICE FOR PROCESSING INFORMATION AND STORAGE MEDIUM

CROSS-REFERENCE TO RELATED APPLICATIONS

The present application is based upon and claims priority to Chinese Patent Application No. 201811150840.0, filed Sep. 29, 2018, the entire contents of which are incorporated herein by reference.

TECHNICAL FIELD

The present disclosure relates to information processing technologies, in particular, to a method and a device for processing information and a storage medium.

BACKGROUND

Mobile equipment, also known as mobile devices (MD), can access a variety of information whenever and wherever possible. Mobile devices with information processing functions are increasingly favored by users, and at the same time, bring convenience to the users' daily life and/or work.

SUMMARY

In order to overcome problems in related arts, embodiments of the present disclosure provide a method and a device for processing information, and a storage medium. The technical solutions are as follows.

According to a first aspect of an embodiment of the present disclosure, there is provided a method for processing information, including: obtaining intensities of electromagnetic radiation of locations which a mobile device passes during movement of the mobile device; creating a distribution map of electromagnetic radiation according to the intensities of electromagnetic radiation, the distribution map of electromagnetic radiation being configured to reflect an electromagnetic radiation distribution of the route of the mobile device; and generating a protective measure against the electromagnetic radiation according to the distribution map of electromagnetic radiation.

According to a second aspect of an embodiment of the present disclosure, there is provided a device for processing information, including a processor; and a memory configured to store instructions, wherein the processor is configured to execute the instructions to: obtain intensities of electromagnetic radiation of locations which a mobile device passes during movement of the mobile device; create a distribution map of electromagnetic radiation according to the intensities of electromagnetic radiation, the distribution map of electromagnetic radiation being configured to reflect an electromagnetic radiation distribution of the route of the mobile device; generate a protective measure against the electromagnetic radiation according to the distribution map of electromagnetic radiation.

According to a third aspect of an embodiment of the present disclosure, there is provided a non-transitory computer-readable storage medium having stored therein instructions that, when executed by a processor of a mobile device, cause the mobile device to perform a method for processing information, the method including: obtaining intensities of electromagnetic radiation of locations which the mobile device passes during movement of the mobile device; creating a distribution map of electromagnetic radiation according to the intensities of electromagnetic radiation, the distribution map of electromagnetic radiation being configured to reflect an electromagnetic radiation distribution of the route of the mobile device; and generating a protective measure against the electromagnetic radiation according to the distribution map of electromagnetic radiation.

It should be appreciated that the above general description and the following detailed description are merely exemplary and explanatory and are not intended to limit the present disclosure.

BRIEF DESCRIPTION OF THE DRAWINGS

The accompanying drawings, which are incorporated in the specification and constitute part of the present specification, illustrate the embodiments in accordance with the present disclosure and explain the principle of the present disclosure together with the specification.

Figure 1:
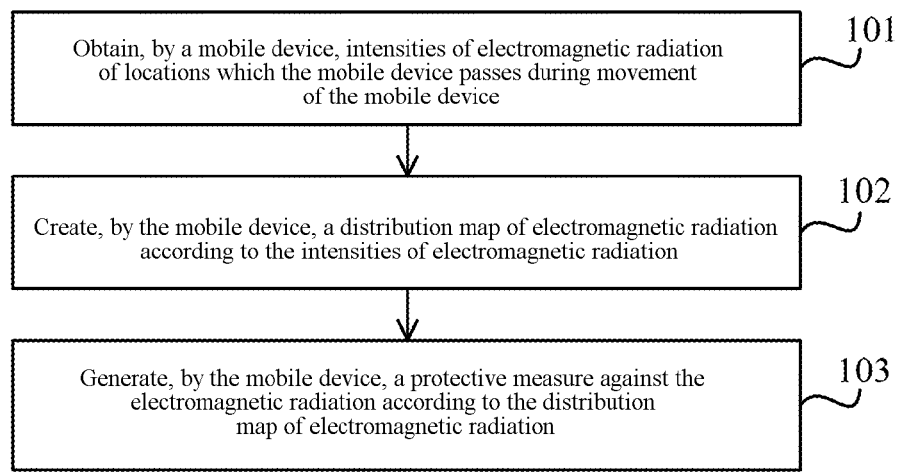
FIG. 1 is a flowchart illustrating a method for processing information according to an exemplary embodiment.

These drawings and description are not intended to limit the scope of the present disclosure in any way, but are used for explaining to those skilled in the art the concept of the present disclosure.

DETAILED DESCRIPTION

Exemplary embodiments will be described in detail herein, examples of which are illustrated in the accompanying drawings. In the drawings, the same or similar reference numerals in different figures indicate the same or similar elements unless otherwise indicated. The implementations set forth in the following description of exemplary embodiments do not represent all implementations consistent with the present disclosure. Instead, they are merely examples of devices and methods consistent with aspects of the present disclosure.

The terms "include" and "have", and any variations thereof, are intended to cover a meaning of non-exclusive inclusion, for example, a system, a product, or a device that includes a series of steps or elements is not necessarily limited to those steps or elements that are expressly listed, but may include other elements not explicitly listed or inherent to such system, product, or device.

In embodiments of the specification, a mobile device, also referred to as mobile equipment, may be a portable terminal device such as a smart phone, a tablet computer, or a wearable device; or may be a smart home product such as a cleaning robot; or may be a vehicle such as a patrol car; or may be an artificial intelligence device such as a drone.

It should be noted that the following specific embodiments may be combined with each other, and the same or similar concepts or processes may not be repeated in some embodiments.

FIG. 1 is a flowchart illustrating a method for processing information according to an exemplary embodiment. The method for processing information may be executable by an information processing device. The information processing device may be implemented by software, or hardware, or a combination of software and hardware. For example, the information processing device may be the mobile device as described above, or the information processing device may be user equipment in communication with the mobile device as described above. This user equipment may be a portable terminal device such as a smart phone, a wearable device or the like, and the present disclosure does not impose specific limitations on this. For example, in the following embodiments, the method is performed by the mobile device.

As shown in FIG. 1, the method may include the following steps.

In step 101, a mobile device obtains intensities of electromagnetic radiation of locations which a mobile device passes during movement of the mobile device.

In some embodiments, the mobile device moves within a region. For example, a cleaning robot moves within a family-based region or within a company-based region. Also for example, a drone, a patrol car or the like moves within a factory area, and so on. During the movement of the mobile device, the intensities of electromagnetic radiation of locations which the mobile device passes during its movement is obtained by the mobile device or a measurement device provided on the mobile device. Here, the intensities of electromagnetic radiation obtained by the mobile device are taken as an example.

It will be appreciated that the respective electromagnetic radiation intensities are generally different for different regions, or for different locations within the same region. In the case of a home, household appliances such as a refrigerator, an oven, and a microwave oven are placed in the kitchen. When the above-mentioned household appliances are simultaneously turned on, the electromagnetic radiation intensity in the kitchen is greater than that of the living room or bedroom. Similarly, the electromagnetic radiation intensity of the same position may be different at different time periods. The kitchen is still taken as an example. When other conditions are constant, the electromagnetic radiation intensity when the oven is turned on is greater than the electromagnetic radiation intensity when the oven is turned off. Therefore, the mobile device can obtain the electromagnetic radiation intensities at different positions by movement, or the electromagnetic radiation intensities of the same position at different time periods.

The electromagnetic radiation intensities are used to measure the magnitude of the electromagnetic radiation, which may also be referred to as electromagnetic radiation value, electromagnetic radiation magnitude, and the like, and the embodiments of the present disclosure are not limited thereto.

In step 102, the mobile device creates a distribution map of electromagnetic radiation according to the intensities of electromagnetic radiation.

The distribution map of electromagnetic radiation is used to reflect an electromagnetic radiation distribution of a route of the mobile device.

Since, in step 101, the mobile device obtains the intensities of the electromagnetic radiation on the route of the mobile device during its movement, the mobile device can create a distribution map of electromagnetic radiation of its route. The present disclosure does not impose specific limitations on the forms of the distribution map of electromagnetic radiation. For example, the distribution map of electromagnetic radiation may be a superposition of the environmental map and the electromagnetic radiation intensities, or the electromagnetic radiation distribution map may be a superposition of the environmental map and the description of electromagnetic radiation intensities, and so on.

In step 103, the mobile device generates a protective measure against the electromagnetic radiation according to the distribution map of electromagnetic radiation.

The distribution map of electromagnetic radiation vividly presents the distribution of electromagnetic radiation within a region. Therefore, the mobile device can generate protective measures against electromagnetic radiation according to the electromagnetic radiation intensity of each place to reduce the harm of electromagnetic radiation to people in the region.

In this embodiment, intensities of electromagnetic radiation of locations which a mobile device passes are obtained during movement of the mobile device; a distribution map of electromagnetic radiation is created according to the intensities of electromagnetic radiation, the distribution map of electromagnetic radiation used to reflect an electromagnetic radiation distribution of the route which the mobile device passes; and a protective measure against the electromagnetic radiation is generated according to the distribution map of electromagnetic radiation. The generation of a tailored protective measure against the electromagnetic radiation can be realized by considering the distribution of electromagnetic radiation on the route which the mobile device passes in course of movement of the mobile device, and the embodiment can reduce the hazards imposed by electromagnetic radiation and improve user experience.

In an embodiment, obtaining by the mobile device the intensities of electromagnetic radiation on the route of the mobile device during movement in step 101, may include: the mobile device records the intensities of electromagnetic radiation of locations which the mobile device passes during movement of the mobile device by an electromagnetic radiation measurement device.

The electromagnetic radiation measurement device may be provided on the mobile device. For example, the electromagnetic radiation measurement device may be an electromagnetic radiation measurement instrument. The electromagnetic radiation measurement instrument is a portable health and safety monitoring instrument that can be used to monitor and measure the electromagnetic radiation intensities of fixed or mobile radio equipment such as a high voltage power grid, a broadcast transmitter, or a mobile phone.

For example, when a cleaning robot is working, it can be equipped with an electromagnetic radiation measurement instrument, so that the cleaning robot records the electromagnetic radiation intensities on its route while completing the cleaning work. Other movable electromagnetic field measurement devices can also obtain intensities of electromagnetic radiation on their routes during movement.

Figure 2:
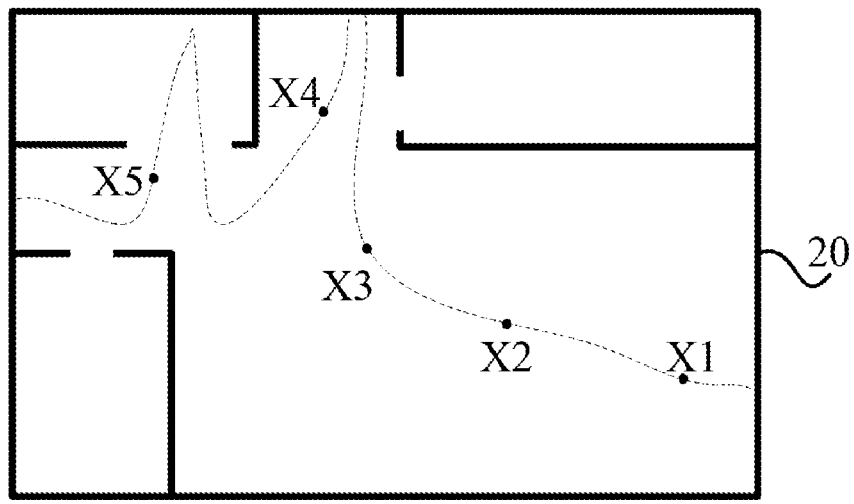
FIG. 2 is a schematic diagram illustrating a distribution map of electromagnetic radiation according to an exemplary embodiment.

In an embodiment, the creating a distribution map of electromagnetic radiation according to the intensities of electromagnetic radiation in step 102, may include: generating a representation of the route which the mobile device passes, and the corresponding intensities of electromagnetic radiation are recorded on the representation of the route. For example, the distribution map of electromagnetic radiation in this embodiment is shown in FIG. 2, which shows a family-based distribution map of electromagnetic radiation. The thick solid line denotes house structures, and the broken line denotes a route which a cleaning robot passes, on which electromagnetic radiation intensities at five positions are shown, respectively corresponding to X1, X2, X3, X4 and X5. It should be noted that the large number in the five numbers X1-X5 does not indicate a large electromagnetic radiation intensity, and these five denotations are merely used to indicate that these five positions may have different intensities of electromagnetic radiation.

The above embodiment provides a specific method for creating a distribution map of electromagnetic radiation, and the present disclosure is not limited thereto.

In an embodiment, the protective measure against the electromagnetic radiation as described above may include at least one of:

1) recommending to take activities during a first time period if an intensity of electromagnetic radiation in the first time period is less than a first preset value;

2) recommending to take activities within a first region if an intensity of electromagnetic radiation within the first region is less than a second preset value;

3) conducting protection with a radiation protection material if an intensity of electromagnetic radiation is greater than a third preset value; or 4) others.

The first preset value, the second preset value and the third preset value may be set according to actual needs. In some embodiments, the first preset value, the second preset value and the third preset value may be the same, or two of them may be the same; and the present disclosure is not limited thereto.

In an embodiment, the third preset value is greater than or equal to a smaller one of the first preset value and the second preset value.

In addition, the radiation protection material as described above may include at least one of radiation protection coating, radiation protection fabric and the like.

For example, there are 100 people visiting a power plant, and the electromagnetic radiation of the equipment in the power plant is relatively low from 8:00 to 10:00 a.m., and accordingly the recommended tour route during this time period is made to reduce the harm of electromagnetic radiation to the visitors.

Figure 3:
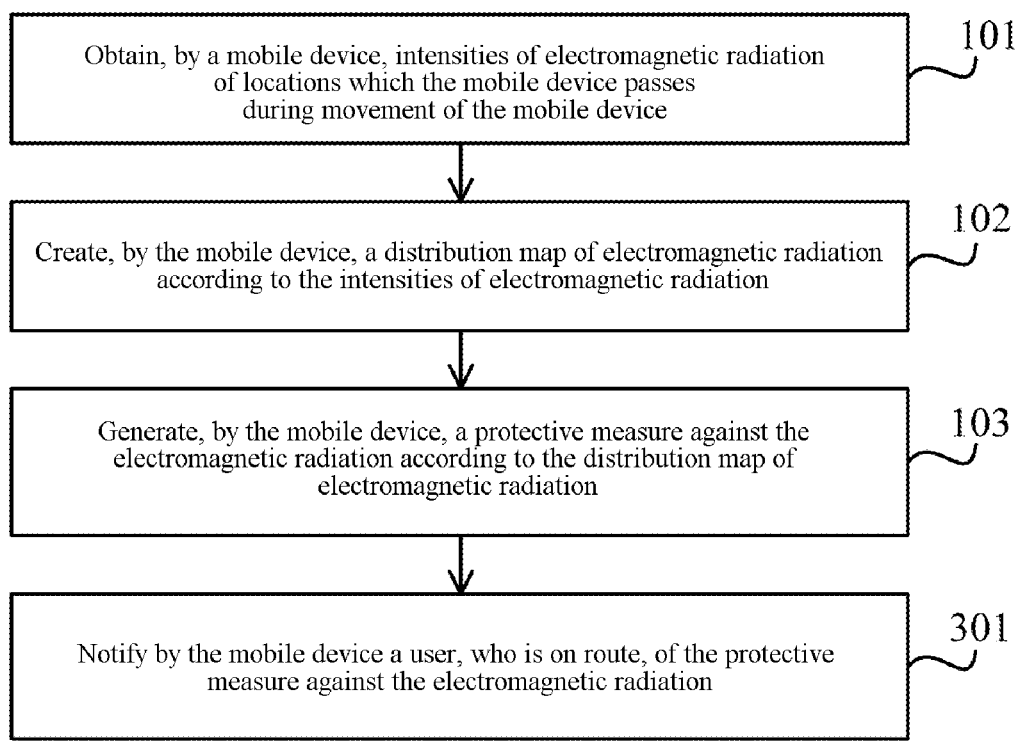
FIG. 3 is a flowchart illustrating a method for processing information according to another exemplary embodiment.

FIG. 3 is a flowchart illustrating a method for processing information according to another exemplary embodiment. As shown in FIG. 3, on the basis of the flowchart as shown in FIG. 1, after generating the protective measure against the electromagnetic radiation according to the distribution map of electromagnetic radiation as described in step 103, the method in this embodiment may further include: notifying a user on the route of the protective measure against the electromagnetic radiation, in step 301.

There are many ways to notify the user of the protective measure against the electromagnetic radiation. For example, the mobile device notifies the user of the protective measure against the electromagnetic radiation through its own display device (such as a display screen). Alternatively and/or additionally, the mobile device notifies the user of the protective measure against the electromagnetic radiation through a terminal device communicating with the mobile device, and so on.

The specific form of the notification may be an audio notification, and/or a video notification. Further, the video notification may refer to that the notification is displayed by the above display device, for example; the audio notification may be a broadcast form; and so on.

In the technical solution provided by the embodiment, the mobile device notifies the user on the route of the mobile device of the protective measure against the electromagnetic radiation, so that the user can conduct the protective measure of electromagnetic radiation, or to enable the user to perform other related protective measure to reduce the harm of electromagnetic radiation according to the protective measure against the electromagnetic radiation, thereby improving user experience.

Figure 4:
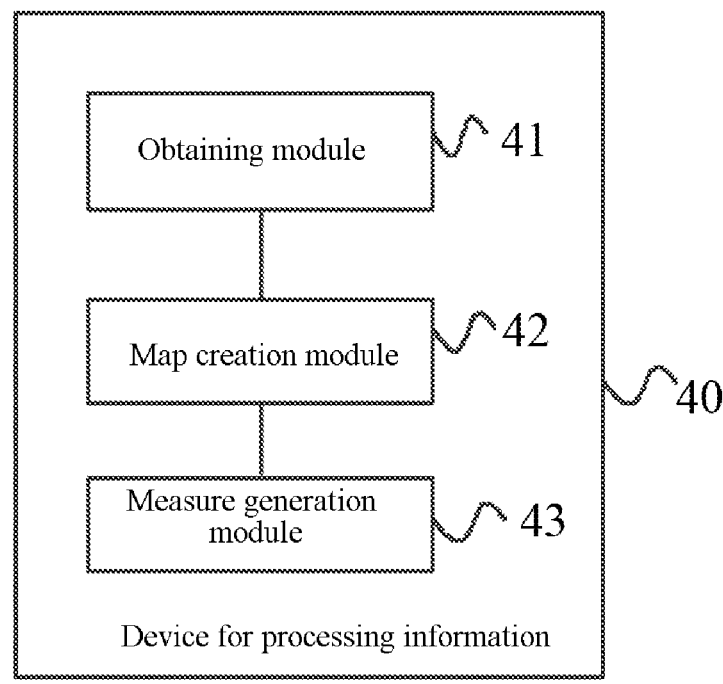
FIG. 4 is a schematic diagram of a device for processing information according to an exemplary embodiment.

FIG. 4 is a schematic diagram of a device 40 for processing information according to an exemplary embodiment. The device 40 for processing information may be implemented with software, or hardware, or a combination of software and hardware, and may be a part or the whole of a mobile device. The corresponding details can be found in the descriptions regarding the embodiment as shown in FIG. 1.

As shown in FIG. 4, the device 40 includes an obtaining module 41, a map creation module 42, and a measure generation module 43.

The obtaining module 41 is configured to obtain intensities of electromagnetic radiation of locations which a mobile device passes during movement of the mobile device.

The map creation module 42 is configured to create a distribution map of electromagnetic radiation according to the intensities of electromagnetic radiation obtained by the obtaining module 41, the distribution map of electromagnetic radiation being configured to reflect an electromagnetic radiation distribution of the route of the mobile device.

The measure generation module 43 is configured to generate a protective measure against the electromagnetic radiation according to the distribution map of electromagnetic radiation created by the map creation module 42.

The device 40 for processing information provided in the embodiment obtains intensities of electromagnetic radiation on a route of a mobile device during movement of the mobile device; creates a distribution map of electromagnetic radiation according to the intensities of electromagnetic radiation, the distribution map of electromagnetic radiation being configured to reflect an electromagnetic radiation distribution of the route of the mobile device; and generates a protective measure against the electromagnetic radiation according to the distribution map of electromagnetic radiation. The generation of a tailored protective measure against the electromagnetic radiation can be realized by considering the distribution of electromagnetic radiation on the route which the mobile device passes during movement of the mobile device, and the embodiment can reduce the hazards imposed by electromagnetic radiation and improve user experience.

In an embodiment, the obtaining module 41 may be further configured to record, by an electromagnetic radiation measurement device, the intensities of electromagnetic radiation of locations which the mobile device passes during movement of the mobile device, the electromagnetic radiation measurement device being provided on the mobile device.

In some embodiments, the map creation module 42 is further configured to generate a representation of the route of the mobile device, and the corresponding intensities of electromagnetic radiation are recorded on the representation of the route.

In an embodiment, the protective measure against the electromagnetic radiation as described above may include at least one of:

a first protective measure against electromagnetic radiation: recommending to act during a first time period if an intensity of electromagnetic radiation in the first time period is less than a first preset value;

a second protective measure against electromagnetic radiation: recommending to act within a first region if an intensity of electromagnetic radiation within the first region is less than a second preset value;

a third protective measure against electromagnetic radiation: conducting protection with a radiation protection material if an intensity of electromagnetic radiation is greater than a third preset value; according to an embodiment, the radiation protection material may include at least one of radiation protection coating, radiation protection fabric and the like; the radiation protection fabric may be for example a radiation protection curtain; or other protective measure against the electromagnetic radiation.

According to an embodiment, the third preset value is greater than or equal to a smaller one of the first preset value and the second preset value.

Figure 5:
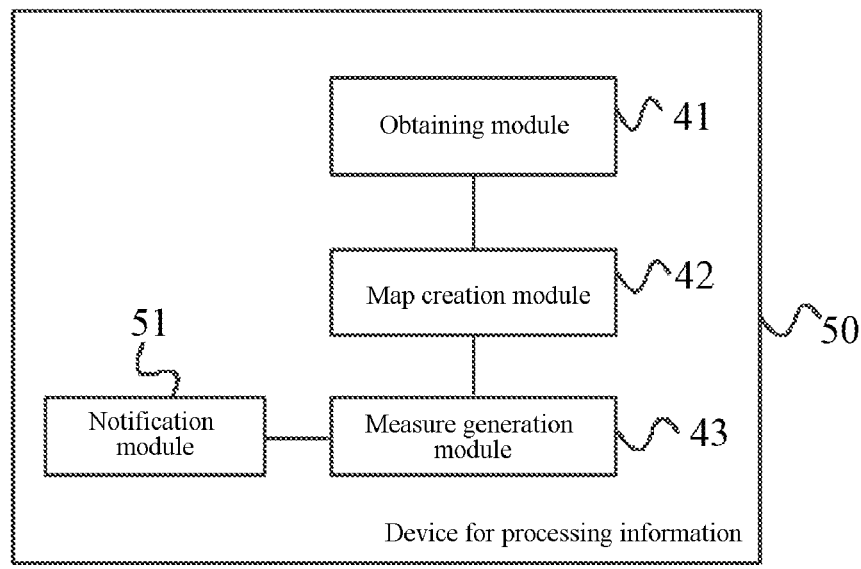
FIG. 5 is a schematic diagram of a device for processing information according to another exemplary embodiment.

FIG. 5 is a schematic diagram of a device 50 for processing information according to another exemplary embodiment. Referring to FIG. 5, on the basis of the structure as shown in FIG. 4, the device 50 may further include a notification module 51.

The notification module 51 is configured to, after the measure generation module 43 generates a protective measure against the electromagnetic radiation according to the distribution map of electromagnetic radiation, notify a user, who is on the route, of the protective measure against the electromagnetic radiation.

In the technical solution provided by the embodiment, the mobile device notifies the user located on the route of the protective measure against the electromagnetic radiation, so that the user can conduct the protective measure of electromagnetic radiation, or to enable the user to perform other related protective measure to reduce the harm of electromagnetic radiation according to the protective measure against the electromagnetic radiation, thereby improving the user experience.

Figure 6:
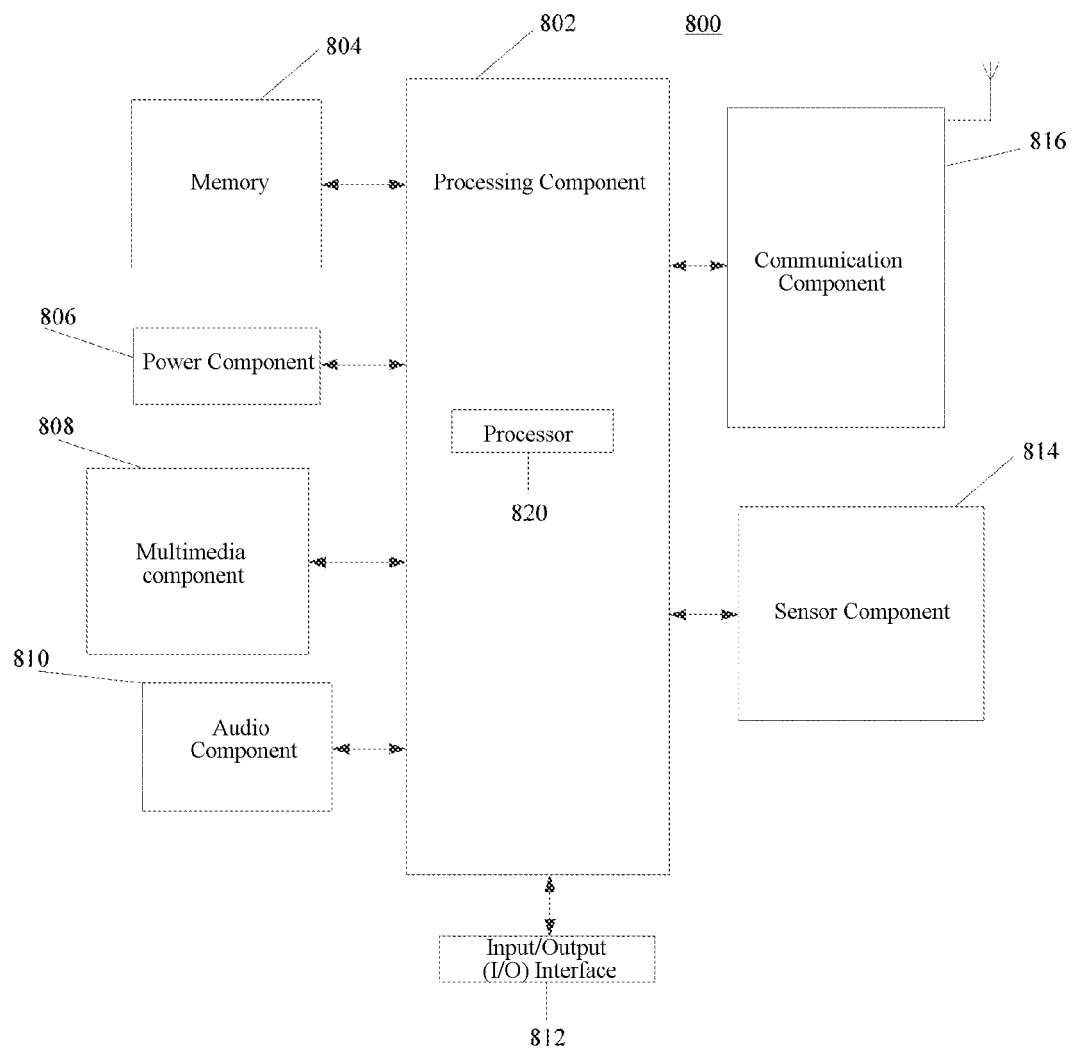
FIG. 6 is a schematic diagram of a device for processing information according to still another exemplary embodiment.

FIG. 6 is a schematic diagram of a device 800 for processing information according to still another exemplary embodiment. Referring to FIG. 6, the device 800 for processing information may include a processing component 802 and a memory 804.

According to an embodiment, the device 800 may further include one or more of the components: a power component 806, a multimedia component 808, an audio component 810, an input/output (I/O) interface 812, a sensor component 814, and a communication component 816.

The processing component 802 typically controls overall operations of the device 800, such as the operations associated with display, data communications, camera operations, and recording operations. The processing component 802 may include one or more processors 820 to execute instructions to perform all or a part of the steps in the above-described methods. In addition, the processing component 802 may include one or more modules which facilitate the interaction between the processing component 802 and other components. For example, the processing component 802 may include a multimedia module to facilitate the interaction between the multimedia component 808 and the processing component 802.

The memory 804 is configured to store various types of data to support the operations of the device 800. Examples of such data include instructions for any application or method operated on the device 800, contact data, phonebook data, messages, images, videos, and the like. The memory 804 may be implemented using any type of volatile or non-volatile memory apparatuses, or a combination thereof, such as a static random access memory (SRAM), an electrically erasable programmable read-only memory (EE-PROM), an erasable programmable read-only memory (EPROM), a programmable read-only memory (PROM), a read-only memory (ROM), a magnetic memory, a flash memory, a magnetic or optical disk.

The power component 806 provides power to various components of the information processing device 800. The power component 806 may include a power management system, one or more power supplies, and other components associated with the generation, management, and distribution of power in the device 800.

The multimedia component 808 includes a screen providing an output interface between the device 800 and the user. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia component 808 includes a front camera and/or a rear camera. The front camera and/or the rear camera may receive external multimedia data while the device 800 is in an operation mode, such as a photographing mode or a video mode. Each of the front camera and the rear camera may be a fixed optical lens system or have focus and optical zoom capability.

The audio component 810 is configured to output and/or input audio signals. For example, the audio component 810 includes a microphone (MIC) configured to receive an external audio signal when the information processing device 800 is in an operation mode, such as a call mode, a recording mode, or a voice recognition mode. The received audio signal may be further stored in the memory 804 or transmitted via the communication component 816. In some embodiments, the audio component 810 further includes a speaker to output audio signals.

The I/O interface 812 provides an interface between the processing component 802 and a peripheral interface module, such as a keyboard, a click wheel, a button, or the like. The buttons may include, but are not limited to, a home button, a volume button, a starting button, and a locking button.

The sensor component 814 includes one or more sensors to provide status assessments of various aspects of the device 800. For example, the sensor component 814 may detect an open/closed status of the device 800, relative positioning of components, e.g., the display and the keypad, of the device 800, a change in position of the device 800 or a component of the device 800, a presence or absence of user contact with the device 800, an orientation or an acceleration/deceleration of the device 800, and a change in temperature of the device 800. The sensor component 814 may include a proximity sensor configured to detect the presence of nearby objects without any physical contact. The sensor component 814 may also include a light sensor, such as a Complementary Metal Oxide Semiconductor (CMOS) or Charge-coupled Device (CCD) image sensor, for use in imaging applications. In some embodiments, the sensor component 814 may also include an accelerometer sensor, a gyroscope sensor, a magnetic sensor, a pressure sensor, or a temperature sensor.

The communication component 816 is configured to facilitate communications, wired or wirelessly, between the device 800 and other apparatuses. The device 800 may access a wireless network based on a communication standard, such as WiFi, 4G, or 5G, or a combination thereof. In one exemplary embodiment, the communication component 816 receives a broadcast signal or broadcast associated notification information from an external broadcast management system via a broadcast channel. In one exemplary embodiment, the communication component 816 further includes a near field communication (NFC) module to facilitate short-range communications. In some embodiments, For example, the communication component 816 may be implemented based on a radio frequency identification (RFID) technology, an infrared data association (IrDA) technology, an ultra-wideband (UWB) technology, a Bluetooth (BT) technology, Wireless-Fidelity (Wi-Fi) technology, and other technologies.

In exemplary embodiments, the device 800 may be implemented with one or more application specific integrated circuits (ASICs), digital signal processors (DSPs), digital signal processing apparatuses (DSPDs), programmable logic apparatuses (PLDs), field programmable gate arrays (FPGAs), controllers, micro-controllers, microprocessors, or other electronic components, for performing the above-described methods.

In exemplary embodiments, there is also provided a non-transitory computer readable storage medium, such as the memory 804 including instructions, executable by the processor 820 in the device 800, for performing the above-described methods. For example, the non-transitory computer-readable storage medium may be a ROM, a random access memory (RAM), a compact disc read-only memory (CD-ROM), a magnetic tape, a floppy disc, an optical data storage apparatus, or the like.

There is provided a computer-readable storage medium, on which a computer program is stored, when the computer program is executed by a processor, the processor can execute the methods for processing information in the any one of the above embodiments.

Other embodiments of the present disclosure will be apparent to those skilled in the art after considering the specification and practicing the invention disclosed herein. The present application is intended to cover any variations, uses, or adaptations of the present disclosure, which are in accordance with the general principles of the present disclosure and include common knowledge or customary technical means in the art that are not disclosed in the present disclosure. The specification and embodiments are to be regarded as illustrative only, and the true scope and spirit of the present disclosure will be defined by the appended claims.

It will be appreciated that the present disclosure is not limited to the exact construction that has been described above and illustrated in the accompanying drawings, and that various modifications and changes can be made without departing from the scope thereof. The scope of the present disclosure is only defined by the appended claims.

What is claimed is:

1. A method for processing information, comprising:
   obtaining intensities of electromagnetic radiation of locations which a mobile device passes during movement of the mobile device;
   creating a distribution map of electromagnetic radiation according to the intensities of electromagnetic radiation, the distribution map of electromagnetic radiation being configured to reflect an electromagnetic radiation distribution of a route which the mobile device passes; and
   generating a protective measure against the electromagnetic radiation according to the distribution map of electromagnetic radiation,
   wherein creating the distribution map of electromagnetic radiation according to the intensities of electromagnetic radiation, comprises:
   generating a representation of the route which the mobile device passes; and
   recording corresponding intensities of electromagnetic radiation on the representation of the route.

2. The method according to claim 1, wherein obtaining intensities of electromagnetic radiation of locations which a mobile device passes during movement of the mobile device, comprises:
   recording, by an electromagnetic radiation measurement device, the intensities of electromagnetic radiation of the locations which the mobile device passes during the movement of the mobile device, the electromagnetic radiation measurement device being provided on the mobile device.

3. The method according to claim 1, wherein the protective measure against the electromagnetic radiation comprises at least one of:
   recommending to act during a first time period if an intensity of electromagnetic radiation in the first time period is less than a first preset value;
   recommending to act within a first region if an intensity of electromagnetic radiation within the first region is less than a second preset value; or
   conducting protection with a radiation protection material if an intensity of electromagnetic radiation is greater than a third preset value,
   wherein the third preset value is greater than or equal to a smaller one of the first preset value and the second preset value.

4. The method according to claim 3, wherein the radiation protection material comprises at least one of radiation protection coating or radiation protection fabric.

5. The method according to claim 1, wherein, after generating a protective measure against the electromagnetic radiation according to the distribution map of electromagnetic radiation, the method further comprises:
   notifying a user on the route of the protective measure against the electromagnetic radiation.

6. The method according to claim 1, wherein the mobile device is one of a smart phone, a tablet, a wearable device, a cleaning robot, a patrol car, or a drone.

7. A device for processing information, comprising:
   a processor; and
   a memory for storing instructions,
   wherein the processor is configured to execute the instructions to:
   obtain intensities of electromagnetic radiation of locations which a mobile device passes during movement of the mobile device;
   create a distribution map of electromagnetic radiation according to the intensities of electromagnetic radiation, the distribution map of electromagnetic radiation being configured to reflect an electromagnetic radiation distribution of a route which the mobile device passes; and
   generate a protective measure against the electromagnetic radiation according to the distribution map of electromagnetic radiation,
   wherein, in creating the distribution map of electromagnetic radiation according to the intensities of electromagnetic radiation, the processor is further configured to execute the instructions to:

generate a representation of the route which the mobile device passes; and record corresponding intensities of electromagnetic radiation on the representation of the route.

8. The device according to claim 7, wherein the processor is further configured to execute the instructions to:

record, by an electromagnetic radiation measurement device, the intensities of electromagnetic radiation of the locations which the mobile device passes during the movement of the mobile device, the electromagnetic radiation measurement device being provided on the mobile device.

9. The device according to claim 7, wherein the protective measure against the electromagnetic radiation comprises at least one of:

recommending to act during a first time period if an intensity of electromagnetic radiation in the first time period is less than a first preset value;

recommending to act within a first region if an intensity of electromagnetic radiation within the first region is less than a second preset value; and conducting protection with a radiation protection material if an intensity of electromagnetic radiation is greater than a third preset value, wherein the third preset value is greater than or equal to a smaller one of the first preset value and the second preset value.

10. The device according to claim 9, wherein the radiation protection material comprises at least one of radiation protection coating or radiation protection fabric.

11. The device according to claim 7, wherein the processor is further configured to execute the instructions to:

after generating the protective measure against the electromagnetic radiation according to the distribution map of electromagnetic radiation, notify a user on the route of the protective measure against the electromagnetic radiation.

12. The device according to claim 7, wherein the mobile device is one of a smart phone, a tablet, wearable device, a cleaning robot, a patrol car, or a drone.

13. A non-transitory computer-readable storage medium having stored therein instructions that, when executed by a processor of a mobile device, cause the mobile device to perform a method for processing information, the method comprising:

obtaining intensities of electromagnetic radiation of locations which the mobile device passes during movement of the mobile device;

creating a distribution map of electromagnetic radiation according to the intensities of electromagnetic radiation, the distribution map of electromagnetic radiation being configured to reflect an electromagnetic radiation distribution of a route which the mobile device passes; and generating a protective measure against the electromagnetic radiation according to the distribution map of electromagnetic radiation, wherein creating the distribution map of electromagnetic radiation according to the intensities of electromagnetic radiation, comprises:

generating a representation of the route which the mobile device passes; and recording corresponding intensities of electromagnetic radiation on the representation of the route.

14. The non-transitory computer-readable storage medium according to claim 13, wherein obtaining intensities of electromagnetic radiation of locations which a mobile device passes during movement of the mobile device, comprises:

recording, by an electromagnetic radiation measurement device, the intensities of electromagnetic radiation of the locations which the mobile device passes during the movement of the mobile device, the electromagnetic radiation measurement device being provided on the mobile device.

15. The non-transitory computer-readable storage medium according to claim 13, wherein the protective measure against the electromagnetic radiation comprises at least one of:

recommending to act during a first time period if an intensity of electromagnetic radiation in the first time period is less than a first preset value;

recommending to act within a first region if an intensity of electromagnetic radiation within the first region is less than a second preset value; or conducting protection with a radiation protection material if an intensity of electromagnetic radiation is greater than a third preset value, wherein the third preset value is greater than or equal to a smaller one of the first preset value and the second preset value.

16. The non-transitory computer-readable storage medium according to claim 15, wherein the radiation protection material comprises at least one of radiation protection coating or radiation protection fabric.

17. The non-transitory computer-readable storage medium according to claim 13, wherein, after generating a protective measure against the electromagnetic radiation according to the distribution map of electromagnetic radiation, the method further comprises:

notifying a user on the route of the protective measure against the electromagnetic radiation.

18. The non-transitory computer-readable storage medium according to claim 13, wherein the mobile device is one of a smart phone, a tablet, wearable device, a cleaning robot, a patrol car, or a drone.

* * * * *